(12) United States Patent
Melvin, III et al.

(10) Patent No.: US 7,739,651 B2
(45) Date of Patent: Jun. 15, 2010

(54) METHOD AND APPARATUS TO DETERMINE IF A PATTERN IS ROBUSTLY MANUFACTURABLE

(75) Inventors: Lawrence S. Melvin, III, Hillsboro, OR (US); Daniel F. Beale, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 474 days.

(21) Appl. No.: 11/712,805

(22) Filed: Feb. 28, 2007

(65) Prior Publication Data

US 2007/0162888 A1 Jul. 12, 2007

(51) Int. Cl.
*G06F 17/50* (2006.01)
*G03F 1/00* (2006.01)

(52) U.S. Cl. .................. 716/21; 716/1; 716/4; 716/19; 716/20; 430/5

(58) Field of Classification Search .............. 716/1, 716/4, 5, 19–21; 430/5
See application file for complete search history.

(56) References Cited

U.S. PATENT DOCUMENTS

| | | | |
|---|---|---|---|
| 6,641,746 B2 * | 11/2003 | Houge et al. ............... 216/59 |
| 7,003,758 B2 * | 2/2006 | Ye et al. ..................... 716/21 |
| 7,172,838 B2 * | 2/2007 | Maurer et al. ................ 430/5 |
| 7,260,812 B2 * | 8/2007 | Melvin et al. ................ 716/21 |
| 7,454,739 B2 * | 11/2008 | Huang et al. ................. 716/20 |
| 7,488,933 B2 * | 2/2009 | Ye et al. ..................... 250/252.1 |
| 2005/0076322 A1 * | 4/2005 | Ye et al. ..................... 716/20 |
| 2005/0268256 A1 * | 12/2005 | Tsai et al. .................... 716/4 |
| 2006/0079983 A1 * | 4/2006 | Willis ........................ 700/108 |
| 2007/0105029 A1 * | 5/2007 | Ausschnitt .................. 430/30 |
| 2007/0204256 A1 * | 8/2007 | Brunet et al. ................ 716/13 |
| 2008/0276211 A1 * | 11/2008 | Li et al. ...................... 716/9 |

* cited by examiner

*Primary Examiner*—Helen Rossoshek
(74) *Attorney, Agent, or Firm*—Park, Vaughan & Fleming LLP

(57) ABSTRACT

One embodiment provides a method to determine if a pattern is robustly manufacturable. During operation, the system may receive a first pattern and a design intent, wherein the first pattern is intended to generate the design intent. Next, the system may determine a second pattern using the design intent, wherein subjecting the second pattern to a second manufacturing process is expected to generate a third pattern that is substantially similar to the design intent. The system may then determine if a first semiconductor manufacturing process is capable of robustly manufacturing the second pattern. If the second pattern is not robustly manufacturable, the system may generate an indicator that indicates that the first pattern is not robustly manufacturable.

9 Claims, 5 Drawing Sheets

METHOD AND APPARATUS TO DETERMINE IF A PATTERN IS ROBUSTLY MANUFACTURABLE

RELATED APPLICATION

This application is related to U.S. Pat. No. 7,207,029, entitled, "CALCULATING ETCH PROXIMITY-CORRECTION USING IMAGE-PRECISION TECHNIQUES," by inventors Dan Beale, Jim Shiely, and John Stirniman, filed on 29 Sep. 2004, which is hereby incorporated by reference to describe an etch process model. This application is also related to U.S. Pat. No. 7,234,129, entitled, "CALCULATING ETCH PROXIMITY-CORRECTION USING OBJECT-PRECISION TECHNIQUES," by inventors Dan Beale, Jim Shiely, and John Stirniman, filed on 29 Sep. 2004, which is hereby incorporated by reference to describe an etch process model. Further, this application is related to U.S. patent application Ser. No. 11/357,304, entitled, "METHOD AND APPARATUS FOR DETERMINING A PROXIMITY CORRECTION USING A VISIBLE AREA MODEL," by inventor Dan Beale, filed on 17 Feb. 2006, which is hereby incorporated by reference to describe techniques and systems to determine a proximity correction using a visible area model. Additionally, this application is related to U.S. Pat. No. 7,251,807, entitled, "METHOD AND APPARATUS FOR IDENTIFYING A MANUFACTURING PROBLEM AREA IN A LAYOUT USING A PROCESS-SENSITIVITY MODEL," by inventors Lawrence S. Melvin III and James P. Shiely filed on 24 Feb. 2005, which is hereby incorporated by reference to describe a process-sensitivity model.

BACKGROUND

1. Field of the Invention

The present invention relates to integrated circuit design and fabrication. More specifically, the present invention relates to a method and an apparatus to determine if a pattern is robustly manufacturable.

2. Related Art

The dramatic improvements in semiconductor integration densities have largely been achieved through corresponding improvements in semiconductor manufacturing technologies.

Semiconductor manufacturing technologies typically include a number of processes which involve complex physical and chemical interactions. Since it is almost impossible to perfectly control these complex interactions, semiconductor manufacturing processes typically have process variations that can cause the manufactured patterns to be different from the design intent. If this difference is too large, it can lead to manufacturing problems which can reduce the yield and/or reduce the performance of the integrated circuit. Hence, to be economically viable, a pattern has to be robust with respect to process variations, i.e., it must be able to tolerate a large enough range of process variations.

Improving the process window directly results in cost savings. This is because improving the process window can substantially increase the throughput by reducing the amount of time spent on inspection, servicing, and maintenance of the equipment. In addition, the actual process conditions encountered during manufacturing may vary due to a variety of reasons. For example, topographical variations on the wafer can occur due to imperfections in the chemical-mechanical polishing process step. As a result, improving the process window can increase the yield for chips that are manufactured in the presence of these process variations.

Unfortunately, improving process window can be very challenging, especially at deep submicron dimensions. To improve the manufacturability of integrated circuits, designers typically use design rule tables that specify what size and shapes of features may be drawn in a design without adversely affecting its manufacturability. Unfortunately, at deep submicron dimensions, design rule tables can easily become unmanageably large. Moreover, design rule tables can be overly restrictive which can prevent designers from being able to achieve the best device performance.

Subtle manufacturing problems may not be identified until at a very late stage in the design and fabrication flow which can substantially increase project costs. Hence, it is highly desirable to identify subtle manufacturing problems as early as possible so that these problems can be fixed without substantially increasing costs.

SUMMARY

One embodiment provides, among other things, a system that can identify subtle manufacturing problems in a design layout. Specifically, an embodiment can identify patterns that are not robustly manufacturable, thereby allowing a designer to correct the manufacturing problems.

Due to iso-dense etch bias, the input pattern to an etch process must sometimes be different from the design intent. The input pattern to the etch process is typically generated by a photolithography process. Hence, a design intent may not be manufacturable if the required input pattern to the etch process cannot be generated by the photolithography process.

An embodiment can identify, among other things, subtle manufacturing problems that may arise due to inconsistent constraints of two or more semiconductor manufacturing processes. The system can generate a pattern by applying an inverse process-model to a design intent. The inverse process-model can model the inverse of the effect of a second semiconductor manufacturing process. Next, the system can use a process-sensitivity model to identify regions in the pattern that may not be robustly manufacturable by a first semiconductor manufacturing process. The process-sensitivity model can model the sensitivity of the first semiconductor manufacturing process to process variations. The system may identify manufacturing problems by convolving the pattern with the process-sensitivity model and then comparing the result with a threshold.

In another embodiment, the system may identify manufacturing problems using a compound process-model. The compound process-model may be determined by combining an inverse process-model (e.g., an etch proximity-correction model) with a process sensitivity model (e.g., a focus sensitivity model).

DETAILED DESCRIPTION

Integrated Circuit (IC) Design Flow

Figure 1:
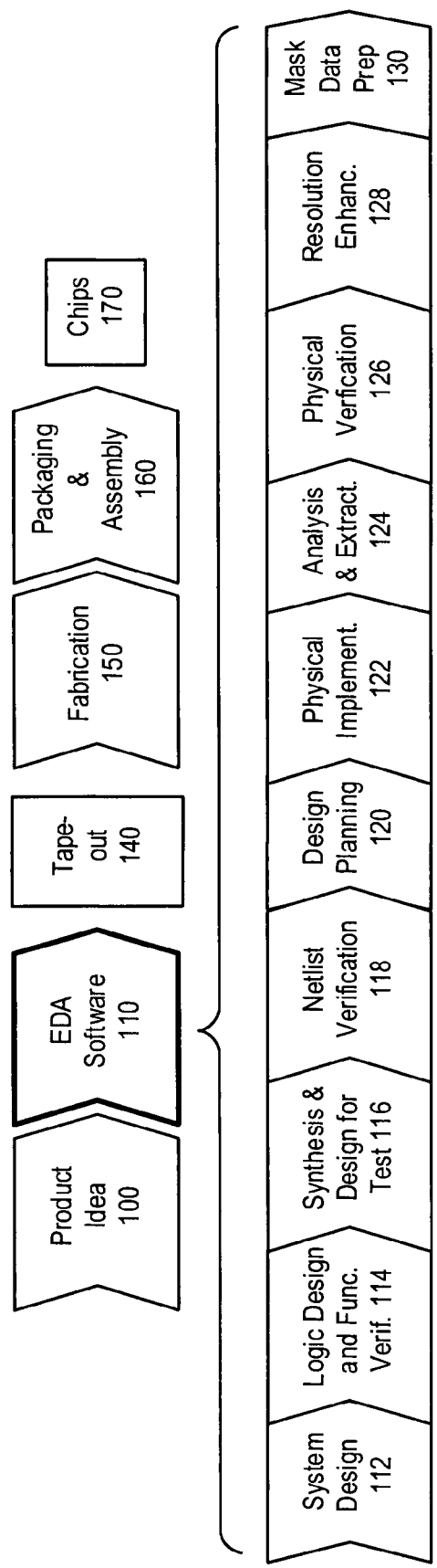
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the conception of the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/ Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above-described steps. Specifically, one embodiment of the present invention can be used during the physical verification step 126.

Process Models

A process model models the behavior of one or more semiconductor manufacturing processes which typically involve complex physical and chemical interactions. A process model is usually determined by fitting kernel coefficients to empirical data that is obtained using test layouts. The process model usually treats the modeled process as bulk components, which means that atomic and molecular level effects may be treated as a whole.

Once a process model is determined, it can be used for a number of purposes during the design and manufacture of a semiconductor chip. For example, process models are typically used to support Optical Proximity Correction (OPC) and Resolution Enhancement Techniques (RET). These models can allow full-chip database manipulation in reasonable timeframes during the tapeout flow.

When a pattern is subjected to OPC, the designed pattern on the reticle is modified to allow a reasonable approximation of the design intent to be constructed on the wafer. For size sensitive device components, such as the poly gate, the design intent is typically the pattern that is etched into the substrate. For device components (e.g., wires) that are not highly sensitive to variations in size, the design intent can be the pattern that is formed in the photoresist. Size sensitive device layers are generally modeled and corrected to the etch process, while less size critical layers are generally modeled to the photolithography process. When a pattern is modeled to the etch process, several process may be necessary to form the final etched pattern. These processes can include the reticle construction process, the photolithography process, and the etch process itself.

Semiconductor manufacturing processes can be modeled using different approaches. A first approach uses a lumped model of multiple processes. A second approach uses a series of staged models, wherein at each stage, a process is modeled individually.

The RET and OPC usage of the models can be substantially different depending on the approach. A lumped model places all of the processes into one model form. This may have the distinct advantage of improving RET and OPC runtime, and reducing the data necessary to fit a model to a process. However, it may have significant disadvantages in that it is difficult to fit the physical data to a model form. In addition, the final state of the process may be achievable by the final process, but may not be by an intermediate process. Such subtle manufacturing problems would not be detected during the correction. The mask models and photolithography models are usually lumped together because mask constraints can be readily dealt with using a rule table. Etch models are not necessarily lumped models.

Staged models, on the other hand, are models of different manufacturing processes that are used to correct a single pattern. In a staged set of models, data is collected for each process that is modeled, e.g., lithography (lumped with the reticle) and etch. The staged models forms are generally simpler to statistically fit than the lumped forms, resulting in development savings and more accurate models. However, the staged form may have the disadvantage of requiring multiple models to be executed in an OPC or RET process.

Staged etch models have recently become available due to breakthroughs in modeling the etch process. This means that new understandings of the photolithography and etch processes may be discovered. It is possible to etch a pattern that cannot be printed in photoresist, and theoretically achieve a "good" result using conventional process models. When a conventional lumped etch and photolithography model is used, this state will not be found. In other words, prior art techniques may miss subtle manufacturing problems, which may substantially increase project delays and costs. One embodiment of the present invention can identify such unachievable states during design time, thereby allowing the design team to modify the pattern prior to manufacturing to remove the manufacturing problem.

Figure 2:
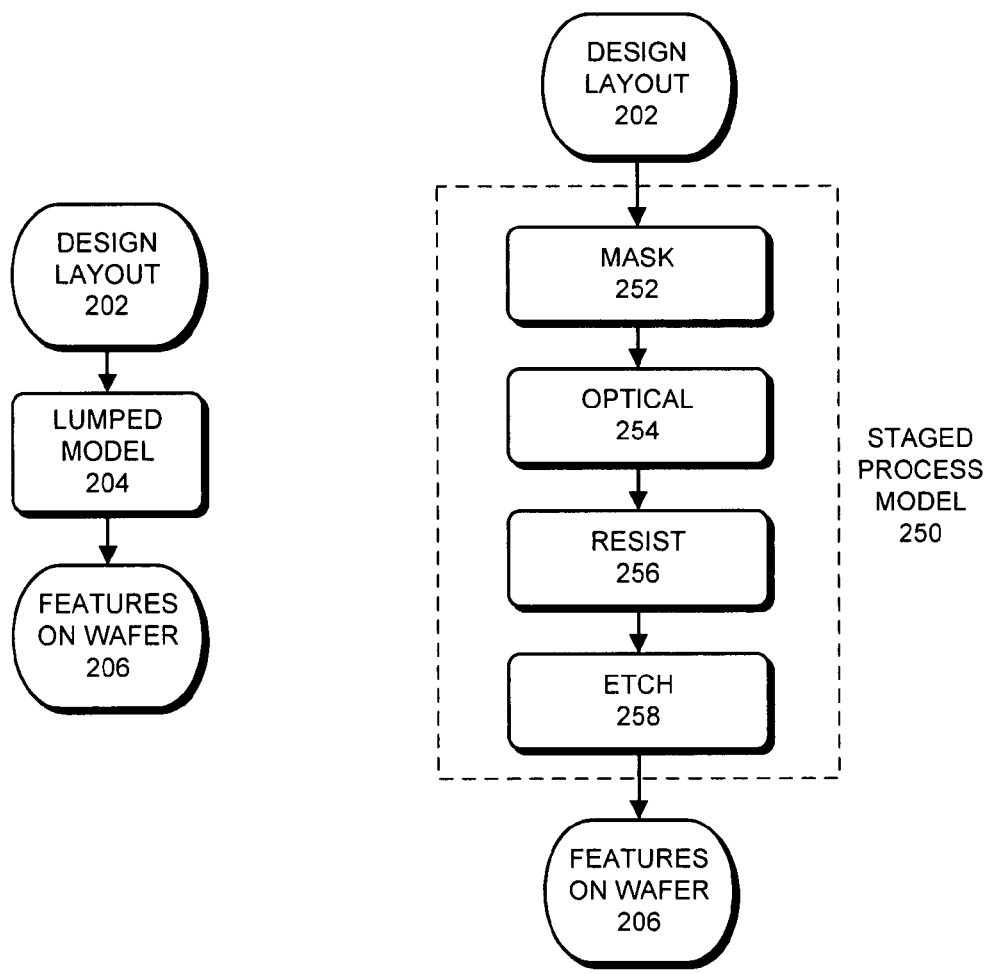
FIG. 2 illustrates a lumped process model and a staged process model in accordance with an embodiment of the present invention.

FIG. 2 illustrates a lumped process model and a staged process model in accordance with an embodiment of the present invention.

Lumped model 204 can predict the features on the wafer 206 using design layout 202. For example, a lumped model can model the combined effect of a photolithography process and an etch process.

Alternatively, staged process model 250 may be used to model different semiconductor manufacturing processes. Specifically, mask writer model 252 can receive design layout 202 and generate a mask layout. The mask layout can then be used by optical process model 254 and the resist model 256 to predict the patterns on the photoresist layer. Next, etch model 258 can model the behavior of the etch process to predict the features on the wafer 206.

The foregoing descriptions of process models have been presented only for purposes of illustration and description. They are not intended to be exhaustive or to limit the present invention to the forms disclosed. For example, a process model can be decomposed into further sub-models. Further, process models can be black box models that fit generic modeling functions to empirical data, or they can be physical models that model the underlying physical processes, or a combination thereof.

Process models that superimpose the individual contributions of neighboring polygons may fail to consider the effects of the relative positions of polygons. Unfortunately, the effects of some semiconductor manufacturing processes, such as etch, may directly depend on the relative positions of these polygons.

Etch Process

An etch process usually transfers the design pattern from the photoresist into a substrate material. It is typically a vacuum process which uses plasma bombardment and chemical reaction to remove material from a substrate in regions that are not masked by photoresist. The photoresist is applied to the surface in a desired pattern using a photolithography process. These two processes—photolithography and etch—typically work together to produce the final shapes on a semiconductor device that will construct the functional components of the circuit.

However, just because a pattern can be etched may not guarantee that the input pattern needed by the etch process can be printed with adequate resolution by the photolithography process. The opposite case is also possible. Specifically, a pattern that can be printed in photoresist may not necessarily be transferred to the substrate with an etch process. A factor in determining the interaction between the etch process and the photolithography processes is the proximity of features relative to each other as specified by the design layout.

Traditionally, the information about process capabilities has been passed to design teams using design rules. However, as manufacturing process nodes are becoming increasing complex in the march to smaller features, the number and complexity of the design rules imposed upon the design team can become unmanageably large. This can lead to design rules that are difficult to place in Design Rule Check (DRC) and prone to error due to the design rule volume and complexity. This can also lead to over aggressive design rules that unnecessarily constrain the design team, thereby increasing the device footprint and reducing device performance. At the same time, this can allow difficult to manufacture configurations onto the chip, increasing chip cost.

A solution to these problems is to use models of the manufacturing processes to identify problem manufacturing areas during the design process. However, a lumped model may miss unachievable states generated between the photolithography and etch processes.

Etch Process Model

Etch proximity-effects are heavily influenced by the relative positions of polygons in a layout. Specifically, one of the important sources for etch proximity-effects is the deposition of passivant molecules during etch processing. Since the pressure in the etch chamber is very low, these molecules usually move in straight lines, i.e., collisionlessly, through the gas phase. Furthermore, passivant molecules typically have a high sticking coefficient. As a result, they deposit preferentially on sidewalls adjacent to wide trench areas. In contrast, the transport of passivant molecules into dense features is limited. Due to these reasons, the positioning of polygons in the layout can play a critical role in determining etch-proximity effects. Consequently, techniques that primarily superimpose the individual contributions of neighboring polygons may not be suitable for modeling etch-proximity effects.

Such proximity effects are not limited to only etch processes. For example, photolithography typically involves many physical and chemical processes, including resist bake and diffusion of photoactive compounds. Hence, photolithography can also exhibit proximity effects that cannot be accounted for by simply superimposing electric field contributions.

One embodiment of the present invention uses a process model that has a visible-area term. The system can dissect polygons in the layout into edges. Next, the system can select a set of edges for determining the value of the visible-area term. It will be apparent that a number of criteria can be used to select the set of edges. Specifically, in one embodiment, the system selects only those edges that are within an interaction region (or range). Furthermore, the system can further whittle down the set of edges by removing occluded edges. Next, the system can determine the value of the visible-are term using the set of edges.

In one embodiment, the system can determine the visible-area term by computing a surface integral of a function over the areas shadowed by the set of edges. Particularly, the function can be inversely proportional to the radial distance from the evaluation point. Specifically, in one embodiment, the function, $f$, is defined as $f(r,\theta)=a/r$, where $(r,\theta)$ are the polar coordinates with respect to the evaluation point, and a is a parameter that is chosen so that a surface integral of the function accurately models the semiconductor manufacturing process in question.

In another embodiment of the present invention, the function, $f$, is a Gaussian function, which is defined as $$f(r, \theta) = ae^{-\left(\frac{r}{b}\right)^2},$$

where $(r,\theta)$ are the polar coordinates with respect to the evaluation point, and a, b are parameters that are chosen so that a surface integral of the function accurately models the semiconductor manufacturing process in question.

Alternatively, the system can calculate the edge-based proximity correction by computing a line integral of a fitting function over the set of edges. Specifically, in one embodiment, the line integral is calculated over only on the visible portion of an edge in the set of edges. If the function is Gaussian, the line integral can be efficiently calculated as the difference of two error functions multiplied by an exponential. For example, if the function is $K(x,y)=e^{-(x^2+y^2)/\sigma^2}$, the value of the line integral evaluated over a vertical edge from $(x_0,y_0)$ to $(x_0,y_1)$ is equal to $$\frac{\sqrt{\pi}}{\sigma/2} \cdot e^{-x_0^2/\sigma^2} \left(erf\left(\frac{y_0}{\sigma}\right) - erf\left(\frac{y_1}{\sigma}\right)\right).$$

Note that, in the above expression, $erf(x)$ represents the error function.

In yet another embodiment, the layout may be a represented using a pixel-map which is typically a 2-dimensional array of pixels. Each pixel is usually associated with an attribute. The system may apply a non-linear filter to the layout to determine a visible area associated with an evaluation point. Specifically, the system may convolve the non-linear filter with the layout at the evaluation point to obtain the visible-area. The system can then use the visible-area in the etch process model.

A non-linear filter can be defined based on the definition of a linear filter. Let H be an operator whose input and output are pixel-maps (or digital images). H is said to be a linear operator (or filter) if, for any two images $f$ and g and any two scalars a and b, the following identity holds:

$$H(a \times f + b \times g) = a \times H(f) + b \times H(g).$$

In other words, the result of applying a linear filter to the sum of two images (that have been multiplied by the constants as shown above) is identical to applying the operator to the images individually, multiplying the results by the appropriate constants, and then adding those results. An operator or filter that does not satisfy the above identity is by definition a non-linear operator or filter.

In one embodiment, the system can apply the non-linear filter by first scanning the layout to determine a set of visible pixels from the evaluation pixel. It will be apparent to one skilled in the art that a number of scanning techniques can be used to determine the set of visible pixels in a pixel-map layout. The system can then determine the visible area by computing a weighted sum of the set of visible pixels.

When a filter is applied to a pixel-map layout, it usually computes an attribute value for the evaluation pixel based on the current attribute values of the evaluation pixel and the attribute values of neighboring pixels. Note that a filter typically has a radius (or region of interest) which identifies the neighboring pixels that are to be used in the computation.

A filter is typically applied to a pixel-map layout (or digital image) by convolving a kernel with the pixel-map layout. In one embodiment, the kernel coefficients of the non-linear filter are determined based on whether the pixel associated with a kernel coefficient is visible from the evaluation pixel or not.

Process-Sensitivity Model

A process-sensitivity model enables a system to quickly determine the process window at a point on a mask layout. Specifically, in one embodiment, the system can determine a process-sensitivity model by first creating an on-target process model that models one or more semiconductor manufacturing processes under nominal process conditions. Next, the system can create one or more off-target process models that model the semiconductor manufacturing processes under one or more process conditions that are different from nominal process conditions. The system can then determine the process-sensitivity model using the on-target model and the off-target models.

In one embodiment, the process-sensitivity model, $F_p$, can be expressed as follows:

$$F_p = \frac{1}{n}\left(\frac{1}{\Delta P_1}(P_t - P_1) + \frac{1}{\Delta P_2}(P_t - P_2) + \ldots + \frac{1}{\Delta P_n}(P_t - P_n)\right),$$

where, $P_{1 \ldots n}$ are off-target process models that model arbitrary (e.g., defocus)

process conditions, $P_t$ is the on-target process model that models a nominal (e.g., best focus) process condition, and $\Delta P_{1 \ldots n}$ are the respective changes in the process conditions between the nominal process condition and the arbitrary $(1 \ldots n)$ process conditions.

When a layout is represented using a pixel-map, the process-sensitivity model can be viewed as a filter which can be convolved with a layout to determine the process latitude at an evaluation point.

Model Based DRC Rules for Etch

One embodiment uses a process-sensitivity model with a wafer etch process. While the photolithography process transfers a design pattern to the wafer in a manner analogous to the way a graphic image is transferred from a photographic negative to a sheet of photographic paper, the etch process carves out the conducting or insulating pathways which will form the circuit itself.

Figure 3:
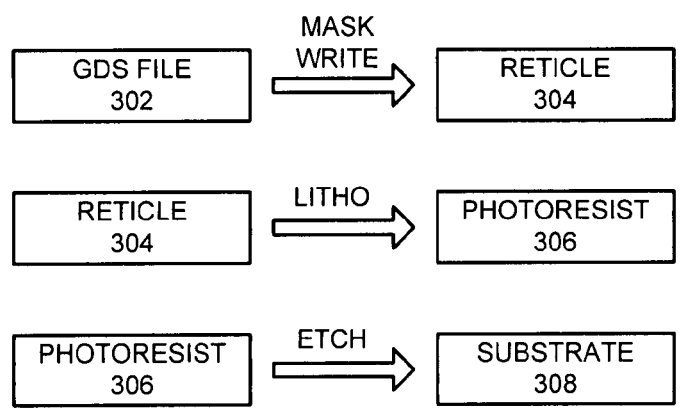
FIG. 3 illustrates pattern transfer processes that are typically used in semiconductor fabrication in accordance with an embodiment of the present invention.

FIG. 3 illustrates pattern transfer processes that are typically used in semiconductor fabrication in accordance with an embodiment of the present invention.

First, the OPC-corrected tapeout design is transferred from computer file 302 (e.g., in GDS or OASIS file format) to chrome on glass reticle 304. Second, the pattern is transferred from the reticle 304 to a photoresist pattern 306 on the wafer. Finally, the etch process prints the photoresist pattern 306 into a substrate 308 such as conducting polysilicon or insulating silicon dioxide.

Traditionally photolithography process engineering and etch process engineering have been so separated that the two disciplines may not even share a common terminology. For example, to the photolithography process engineer the term "mask" may refer to the chrome on glass reticle. To the etch process engineer, the term "mask" may mean the developed photoresist pattern. A manufacturing-sensitivity model (MSM) or a process-sensitivity model can enable a designer to determine relevant information from all the sub-disciplines of semiconductor process engineering that may affect the manufacturability of a pattern.

Prior to the 90 nm process node, progress in IC miniaturization came mostly from advances in the photolithography process. However, for the 90 nm process nodes and below etch process steps are often required to shrink line widths further than what photolithography by itself would allow.

Figure 4:
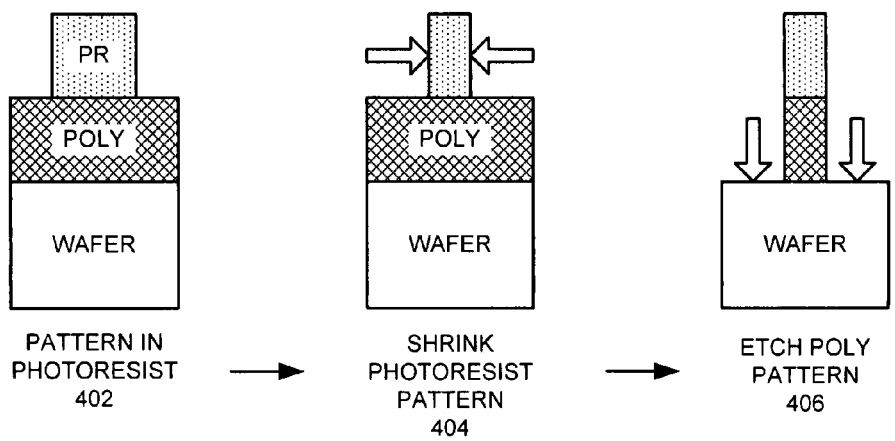
FIG. 4 illustrates an etch process in accordance with an embodiment of the present invention.

FIG. 4 illustrates an etch process in accordance with an embodiment of the present invention.

The system can use photolithography to print a pattern on a photoresist layer (step 402). Next, the etch process can shrink the photoresist pattern (step 404). The etch process can then transfer the photoresist pattern to the substrate (step 406). In this manner, an aggressive etch process can be used to reduce the CD (critical dimension) printed by the photolithography process. However, such techniques can introduce new kinds of proximity errors. Recall that proximity errors involve loss of pattern transfer fidelity, and that the magnitude of these errors depends on the "proximity," i.e., the nearby features in the design layout. One example of a proximity effect is diffraction, which occurs in the photolithography transfer process because the minimum features size is comparable to the wavelength of radiation used. The well-established technique of OPC pre-corrects the layout to reduce this type of proximity error.

However, as mentioned before, etch proximity errors are typically caused by effects of the ionized gas plasma in the vacuum chamber used for etch, and by chemical reaction and transport both in the gas phase and on the surface of the wafer. Etch proximity error can depend on the local layout density due to reactant depletion in areas where the most substrate is etched. Another source of etch proximity error is the iso-dense bias effect which can be an aspect ratio dependent effect in which features that are shadowed by nearby features receive a different etch bias than isolated features.

Figure 5:
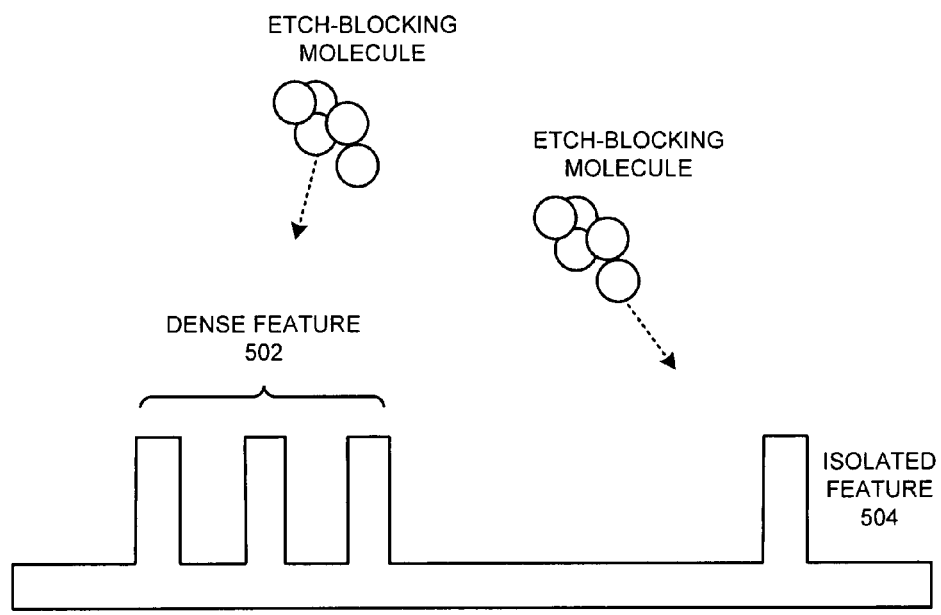
FIG. 5 illustrates how etch-blocking molecules can deposit preferentially on isolated features in accordance with an embodiment of the present invention.

FIG. 5 illustrates how etch-blocking molecules can deposit preferentially on isolated features in accordance with an embodiment of the present invention.

A mechanism that causes the iso-dense bias effect includes the deposition of etch-blocking molecules, which can preferentially coat on an isolated feature 504, more than on a dense feature 502. This deposition can cause the isolated feature 504 to have a positive etch bias with respect to dense feature 502.

Iso-Dense Bias can Result in Unprintable Configurations

Iso-dense bias proximity errors due to etch processing are important to designers because these proximity errors can create a substantial difference in edge placement between "iso" and "dense" features, thereby making some layout configurations unachievable in photoresist. Specifically, if the etch process has the net effect of increasing the CD of any feature due to iso-dense bias, photolithography must print that feature to be smaller than the intended size to compensate for the CD growth that will occur during etch. However, if the photolithography lacks the resolving power needed for this compensation, the feature cannot be printed to design specification.

As an example, consider the case of printing a 90 nm CD. If the etch process for that particular line adds 20 nm to the CD due to iso-dense bias, then the photolithography process must print the CD at 70 nm to produce the correct CD in the post-etch wafer. However, if the photolithography process is not capable of printing CDs less than 90 nm, then due to the etch proximity error, the layout configuration may be unprintable.

One embodiment of the present invention enables designers to locate unprintable regions within a pattern at design verification time. Note that due to the complexity of the plasma processing and reacting gas transport in an etch process chamber, and the materials properties of the wafer and chamber walls, the etch process model may be determined by fitting generic modeling functions to empirical data.

Figure 6:
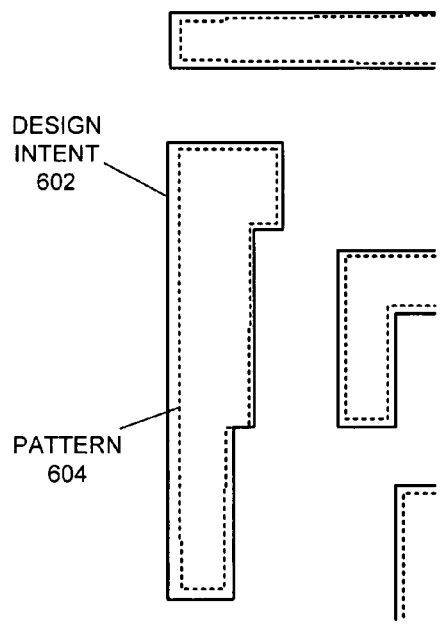
FIG. 6 illustrates how iso-dense bias can result in unprintable configurations in accordance with an embodiment of the present invention.

FIG. 6 illustrates how iso-dense bias can result in unprintable configurations in accordance with an embodiment of the present invention.

An etch proximity correction can be applied to design intent 602 (solid lines) to obtain pattern 604 (dotted lines) that has been corrected for iso-dense bias. Since correction is the inverse of the actual etch process, the (positive) etch bias will be applied to the pattern 604 to yield the design intent 602 during the actual etch process. Note that pattern 604 is the output needed from the photolithography process. In other words, to produce design intent 602 on the final post-etch wafer, the photolithography process must produce pattern 604 in the developed resist prior to the etch step. However, if pattern 604 contains a CD that is too narrow to be resolved by the photolithography process, design intent 602 may be unprintable.

Process for Determining if a Pattern is Robustly Manufacturable

In one embodiment, the system can apply an etch proximity-correction to the design layout to obtain a corrected layout. Next, the system can perform a design rule check on the corrected layout to detect patterns that are expected to have manufacturing problems. For example, the design rule check may identify CD values that are less than the minimum feature printable by the photolithography process.

The system can also chain together the manufacturing sensitivity model and the etch proximity-correction model. First, the system may perform an etch proximity-correction on the design layout to obtain a corrected layout. Next, the system may apply the process-sensitivity model (or manufacturing sensitivity model) to the corrected pattern which represents the desired developed resist pattern (which is the input to the etch process). The output of the process-sensitivity model can be a quantitative estimate of process latitude loss, whereas the output of a design rule check is usually a pass/fail result.

Figure 7:
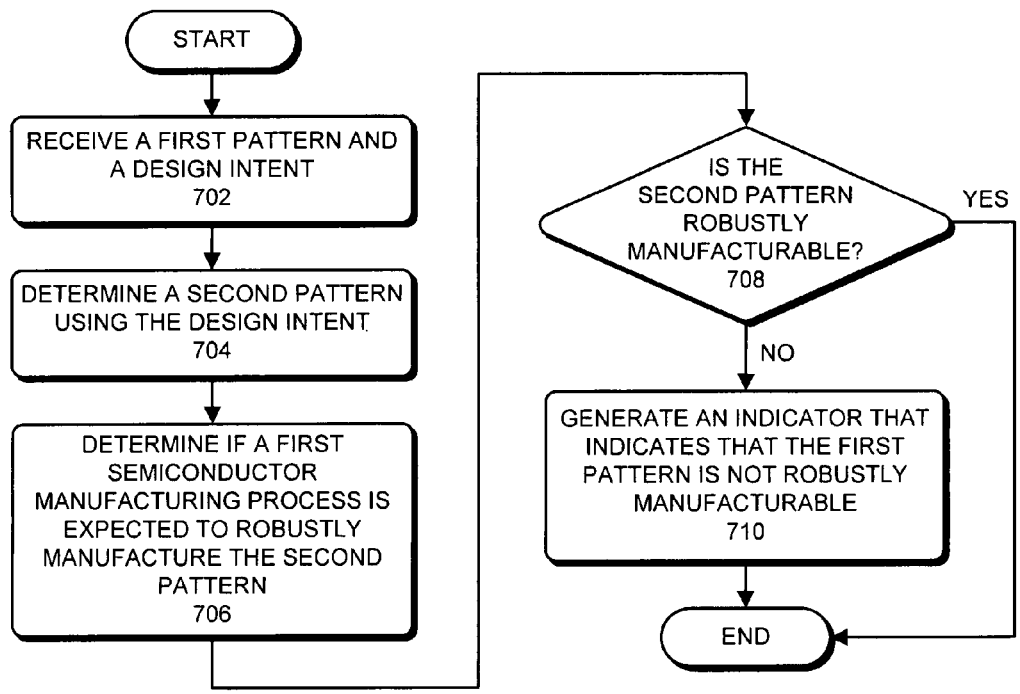
FIG. 7 presents a flowchart that illustrates a process for determining if a pattern is robustly manufacturable in accordance with an embodiment of the invention.

FIG. 7 presents a flowchart that illustrates a process for determining if a pattern is robustly manufacturable in accordance with an embodiment of the invention.

The process usually begins by receiving a first pattern and a design intent (step 702). In one embodiment the first pattern can be the same as the design intent. Further, in one embodiment, the first pattern and/or the design intent can be represented using pixel-maps.

The first pattern is typically subjected to a first semiconductor manufacturing process to obtain an intermediate pattern. Next, the intermediate pattern is subjected to a second semiconductor manufacturing process to obtain a final pattern that is substantially similar to the design intent.

In one embodiment, the first pattern can be a mask pattern and the first semiconductor manufacturing process can be a photolithography process. The intermediate pattern can be a pattern on a photoresist layer that is obtained by subjecting the mask pattern to the photolithography process. The second semiconductor manufacturing process can be an etch process, and the final pattern can be a pattern that is etched on the substrate. Specifically, the final pattern can be obtained by subjecting the intermediate pattern to the etch process.

Next, the system can determine a second pattern using the design intent (step 704). Subjecting the second pattern to the second semiconductor manufacturing process may be expected to generate a third pattern that is substantially similar to the design intent.

In one embodiment, the system can determine the second pattern using a second inverse-process-model which models the inverse of the effect of the second semiconductor manufacturing process. Specifically, the system can apply the second inverse-process-model to the design intent to obtain the second pattern. For example, the second inverse-process-model can be an inverse etch-process-model or an etch proximity-correction model.

In another embodiment, the system can determine the second pattern using a second process-model which models the effect of the second semiconductor manufacturing process. For example, the second process-model can be an etch process-model. The system can start with an initial pattern. Next, the system can iteratively perturb the initial pattern so that when the perturbed pattern is processed by the second process-model, the result is substantially similar to the design intent.

The system can then determine whether the second pattern is robustly manufacturable by a first semiconductor manufacturing process (step 706). Specifically, the system can determine a second indicator which indicates whether the second pattern is robustly manufacturable by a first semiconductor manufacturing process.

In one embodiment, the system determines whether the first semiconductor manufacturing process can realize the second pattern. Specifically, the system can use design rules to determine if the first semiconductor manufacturing process can robustly manufacture the second pattern. For example, the system can determine if the width of a feature in the second pattern is less than a minimum feature width that can be robustly manufactured using the first semiconductor manufacturing process. If so, the first semiconductor manufacturing process may not be able to robustly manufacture the second pattern.

If the first semiconductor manufacturing process is a photolithography process, the system can use design rules to determine whether the photolithography process can generate the second pattern on the photoresist layer.

In another embodiment, the system can determine a process window at an evaluation point in the second pattern. Specifically, if the process window is too small (e.g., less than a low threshold), the system may determine that a region in the second pattern is not robustly manufacturable. Conversely, if the process window is sufficiently large (e.g., greater than a high threshold), the system may determine that a region in the second pattern is robustly manufacturable.

The system can determine a process window at an evaluation point by convolving the second pattern with a manufacturing sensitivity model or a process sensitivity model. In one embodiment, the manufacturing sensitivity model can be a photolithography process-sensitivity-model which models the sensitivity of a photolithography process to variations in focus. In other words, the photolithography process-sensitivity-model can estimate the extent of focus variations that the second pattern can tolerate without substantially losing pattern fidelity.

In another embodiment, the system can first determine a pre-image of the second pattern using a first inverse-process-model that models the inverse of the effect of the first semiconductor manufacturing process. In other words, subjecting the pre-image to the first semiconductor manufacturing process is expected to generate the second pattern. The system can determine the pre-image by convolving the second pattern with the first inverse-process-model. Next, the system can apply a set of design rules to the pre-image to determine if the second pattern is robustly manufacturable. Alternatively, the system can convolve the pre-image with the manufacturing sensitivity model to determine if the second pattern is robustly manufacturable.

In yet another embodiment, the system can convolve the first inverse-process-model with the process-sensitivity model to obtain a compound-process-model. Next, the system can convolve the second pattern with the compound-process-model to determine whether the second pattern is robustly manufacturable.

In yet another embodiment, the system can combine the second inverse-process-model (e.g., etch proximity-correction model) and the process-sensitivity model to obtain a compound-process-model. Next, the system can use this compound-process-model to determine whether the design intent or the first pattern is robustly manufacturable.

In a further variation, the system may combine the second inverse-process-model, the process-sensitivity model, and the first inverse-process-model to obtain yet another compound-process-model. The system can then use this compound-process model to determine if the first pattern or the design intent is robustly manufacturable.

If the second pattern is not robustly manufacturable (step 708), the system can generate an indicator that indicates that the first pattern is not robustly manufacturable (step 710). In one embodiment, the system can use the second indicator to generate a first indicator that indicates whether the first pattern is robustly manufacturable.

Specifically, the system can identify a feature in the second pattern that is not robustly manufacturable. For example, the system may identify a feature in the second pattern that does not have a sufficiently large process window. Next, the system may generate an indicator that identifies a corresponding feature in the first pattern. The system may report the locations (e.g., coordinates) of evaluation points where the estimated process window is smaller than a threshold. The system may store these locations in a database.

Figure 8:
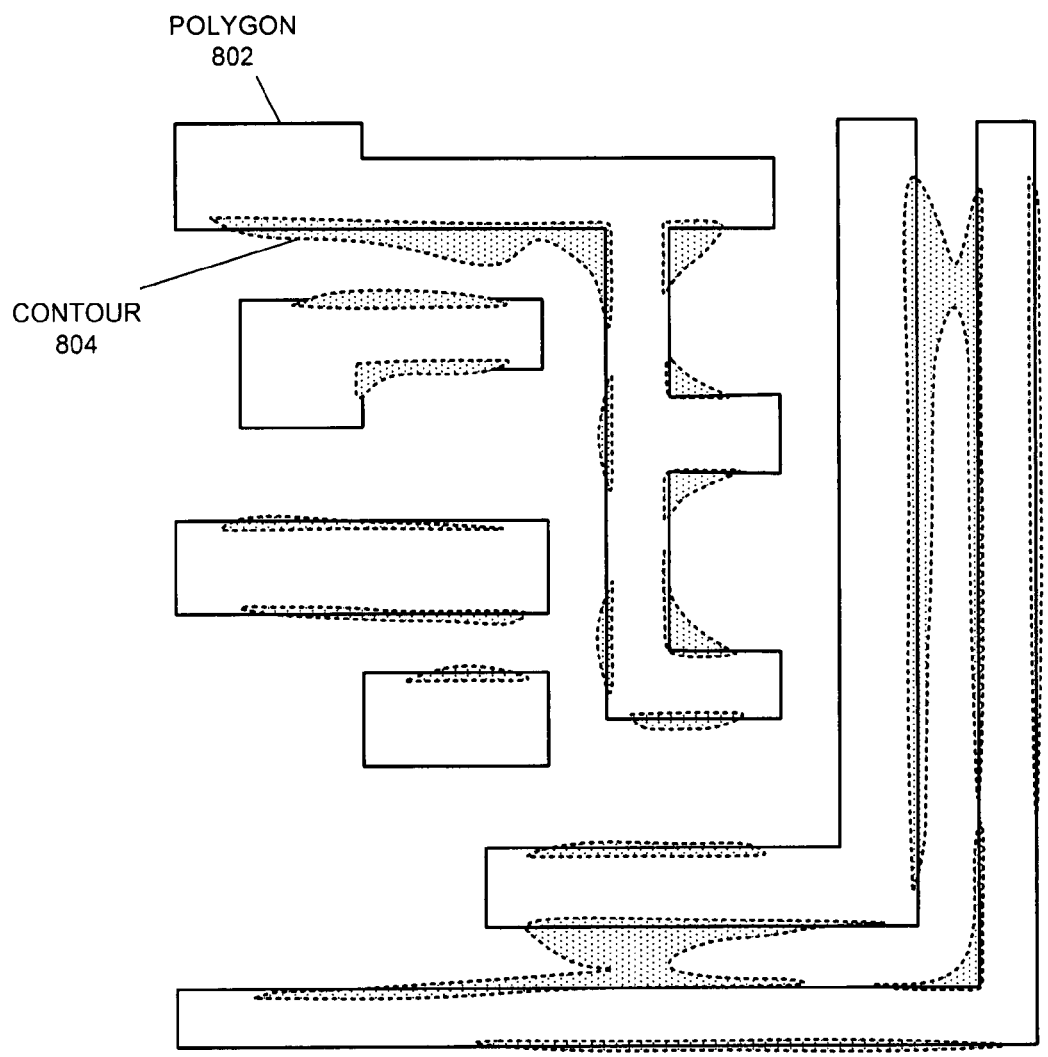
FIG. 8 illustrates how the system may visually highlight regions of a pattern that may not be robustly manufacturable in accordance with an embodiment of the present invention.

FIG. 8 illustrates how the system may visually highlight regions of a pattern that may not be robustly manufacturable in accordance with an embodiment of the present invention.

The pattern (solid lines) shown in FIG. 8 comprises polygon 802. Etch proximity correction can be applied to the pattern to obtain a corrected pattern (not shown). Next, the corrected pattern can be convolved with a process-sensitivity model to obtain a set of process-sensitivity values. The process-sensitivity values can then be compared with a threshold to generate contours (dotted lines). The threshold can be associated with the minimum process window that is required to robustly manufacture the pattern. The system may then superimpose the contours on the pattern, thereby highlighting the regions in the pattern that may not be robustly manufacturable. For example, contour 804 highlights a manufacturing problem area in polygon 802.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A computer-implemented method for determining if a design intent is robustly manufacturable, the method comprising:
   receiving the design intent which is desired to be printed on a wafer using a photolithography process and an etch process;
   determining by computer an etch pre-image for the design intent, wherein subjecting the etch pre-image to the etch process is expected to generate the design intent;
   determining by computer if the etch pre-image is robustly manufacturable by determining whether a process window at an evaluation point in the etch pre-image is within a desired range, wherein determining the process window includes convolving, at the evaluation point, the etch pre-image with a photolithography sensitivity model which models the sensitivity of the photolithography process to process variations; and
   in response to determining that the etch pre-image is not robustly manufacturable, reporting that the design intent is not robustly manufacturable.

2. The method of claim 1, wherein determining the etch pre-image includes applying an inverse-process-model to the design intent which models the inverse of the etch process.

3. The method of claim 1, wherein determining if the etch pre-image is robustly manufacturable includes determining if the etch pre-image is realizable using the photolithography process.

4. A computer-readable storage device storing instructions that when executed by a computer cause the computer to perform a method for determining if a design intent is robustly manufacturable, the method comprising:
   receiving the design intent which is desired to be printed on a wafer using a photolithography process and an etch process;
   determining an etch pre-image using the design intent, wherein subjecting the etch pre-image to the etch process is expected to generate the design intent;
   determining if the etch pre-image is robustly manufacturable by determining whether a process window at an evaluation point in the etch pre-image is within a desired range, wherein determining the process window includes convolving, at the evaluation point, the etch pre-image with a photolithography sensitivity model which models the sensitivity of the photolithography process to process variations; and
   in response to determining that the etch pre-image is not robustly manufacturable, reporting that the design intent is not robustly manufacturable.

5. The computer-readable storage device of claim 4, wherein determining the etch pre-image includes applying an inverse-process-model to the design intent which models the inverse of the effect of the etch process.

6. The computer-readable storage device of claim 4, wherein determining if the etch pre-image is robustly manufacturable includes determining if the etch pre-image is realizable using photolithography manufacturing process.

7. An apparatus for determining if a design intent is robustly manufacturable, the apparatus comprising:
   a receiving mechanism configured to receive the design intent which is desired to be printed on a wafer using a photolithography process and an etch process;
   a first determining mechanism configured to determine an etch pre-image using the design intent, wherein subjecting the etch pre-image to the etch process is expected to generate the design intent;
   a second determining mechanism configured to determine if the etch pre-image is robustly manufacturable by determining whether a process window at an evaluation point in the etch pre-image is within a desired range, wherein determining the process window includes convolving, at the evaluation point, the etch pre-image with a photolithography sensitivity model which models the sensitivity of the photolithography process to process variations; and
   a reporting mechanism configured to, in response to determining that the etch pre-image is not robustly manufacturable, report that the design intent is not robustly manufacturable.

8. The apparatus of claim 7, wherein the first determining mechanism is configured to apply an inverse-process-model to the design intent which models the etch process.

9. The apparatus of claim 7, wherein the second determining mechanism is configured to determine if the etch pre-image is realizable using the photolithography process.

* * * * *